(12) United States Patent
Murthy et al.

(10) Patent No.: US 8,363,758 B2
(45) Date of Patent: *Jan. 29, 2013

(54) METHOD AND SYSTEM FOR AUTOMATIC GAIN CONTROL DURING SIGNAL ACQUISITION

(75) Inventors: Vinay Murthy, San Diego, CA (US); Linbo Li, San Diego, CA (US); Raghuraman Krishnamoorthi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/720,534

(22) Filed: Mar. 9, 2010

(65) Prior Publication Data

US 2010/0158168 A1 Jun. 24, 2010

Related U.S. Application Data

(63) Continuation of application No. 11/397,256, filed on Apr. 3, 2006, now Pat. No. 7,702,046.

(51) Int. Cl.
*H04L 27/08* (2006.01)

(52) U.S. Cl. ........ 375/345; 375/260; 375/267; 375/285; 375/343; 370/280; 370/343; 370/350; 370/252; 455/313; 455/419; 455/160.1

(58) Field of Classification Search .................. 375/345, 375/260, 267, 285, 343; 455/127.2, 313, 455/419, 160.1; 370/280, 343, 350, 252
See application file for complete search history.

(56) References Cited

U.S. PATENT DOCUMENTS

| 6,748,200 | B1 | 6/2004 | Webster et al. |
| 7,336,743 | B2 | 2/2008 | Ma et al. |
| 7,499,508 | B2 * | 3/2009 | Sayeed .......................... 375/345 |
| 7,702,046 | B2 * | 4/2010 | Murthy et al. ................. 375/345 |
| 2002/0042256 | A1 | 4/2002 | Baldwin et al. |
| 2002/0075944 | A1 | 6/2002 | Zalio et al. |
| 2002/0186799 | A1 | 12/2002 | Sayeed |
| 2004/0002308 | A1 * | 1/2004 | Eberle ......................... 455/127.2 |
| 2004/0165656 | A1 | 8/2004 | Shiue et al. |
| 2005/0084035 | A1 | 4/2005 | Kim et al. |
| 2006/0176985 | A1 * | 8/2006 | Tandon et al. ................. 375/345 |
| 2006/0183451 | A1 | 8/2006 | Demir et al. |
| 2007/0058595 | A1 | 3/2007 | Classon et al. |
| 2007/0230636 | A1 | 10/2007 | Murthy et al. |

FOREIGN PATENT DOCUMENTS

| KR | 1020030065590 | 8/2003 |
| WO | 2004082136 | 9/2004 |

OTHER PUBLICATIONS

International Search Report and Written Opinion—PCT/US2007/065896, International Search Authority—European Patent Office—Mar. 9, 2007.
Decision of Grant of Patent for Korean application 2008-7026603 corresponding to U.S. Appl. No. 11/397,256, citing US20040165656, US20020186799 and KR1020030065590 dated Feb. 27, 2011.

* cited by examiner

*Primary Examiner* — Eva Puente
(74) *Attorney, Agent, or Firm* — Ryan N. Farr (57) ABSTRACT

The disclosure is directed to a mobile communication device that includes automatic gain control (AGC) circuitry and operates in either a tracking mode or an acquisition mode. A received signal is sampled n times to calculate an energy estimate that is used to set the gain control values within the AGC circuitry. The value of n varies depending on whether the handset is operating in the acquisition mode or the tracking mode. Acquisition mode is typically considered to be the mode prior to coarse timing acquisition, also referred to as frame acquisition.

61 Claims, 7 Drawing Sheets

FIG. 5

METHOD AND SYSTEM FOR AUTOMATIC GAIN CONTROL DURING SIGNAL ACQUISITION

CLAIM OF PRIORITY UNDER 35 U.S.C. §119

The present Application for Patent is a continuation of U.S. patent application Ser. No. 11/397,256 entitled "Method and System for Automatic Gain Control During Signal Acquisition" filed Apr. 3, 2006, now U.S. Pat. No. 7,702,046 issued on Apr. 20, 2010, assigned to the assignee hereof and hereby expressly incorporated by reference herein.

BACKGROUND

1. Field

The present disclosure relates generally to telecommunications, and more particularly, to systems and methods to support a mobile communications device capable of communicating via a wireless broadcast network.

2. Background

Wireless and wireline broadcast networks are widely deployed to provide various data content to a large group of users. A common wireline broadcast network is a cable network that delivers multimedia content to a large number of households. A cable network typically includes headends and distribution nodes. Each headend receives programs from various sources, generates a separate modulated signal for each program, multiplexes the modulated signals for all of the programs onto an output signal, and sends its output signal to the distribution nodes. Each program may be distributed over a wide geographic area (e.g., an entire state) or a smaller geographic area (e.g., a city). Each distribution node covers a specific area within the wide geographic area (e.g., a community). Each distribution node receives the output signals from the headends, multiplexes the modulated signals for the programs to be distributed in its coverage area onto different frequency channels, and sends its output signal to households within its coverage area. The output signal for each distribution node typically carries both national and local programs, which are often sent on separate modulated signals that are multiplexed onto the output signal.

A wireless broadcast network transmits data over the air to wireless devices within the coverage area of the network. However, a wireless broadcast network can differ from a wireline broadcast network in several key regards. One way in which the two types of networks differ is that mobile handsets may encounter service disruptions, or other activity, that requires them to acquire, reacquire or resynchronize with the broadcast signal being transmitted within the wireless broadcast network. In doing so, the receiver of the mobile handset will typically employ automatic gain control (AGC) within its receiver circuits when acquiring and tracking the broadcast signal. While the concept of AGC has been previously addressed in various wireless networks in different ways, there remains the need for methods and techniques to improve the cost, efficiency, and accuracy of AGC methods and techniques within wireless broadcast networks.

SUMMARY

One aspect of a mobile communications device relates to a receiver including automatic gain control circuitry. The receiver is configured to receive a broadcast signal from a wireless broadcast network, and operate in either an acquisition mode or a tracking mode. Furthermore, the automatic gain control circuitry is configured to set a gain control value based on a first number of samples of the received broadcast signal when the receiver is operating in the acquisition mode and a second number of samples of the received broadcast signal when the receiver is operating in the tracking mode.

Another aspect of a mobile communications device relates to a method for automatic gain control in the mobile communications device. In accordance with this method, a broadcast signal is received from a wireless broadcast network and the device is operated in either an acquisition mode or a tracking mode. A gain control value is set based on a first number of samples of the received broadcast signal when operating in the acquisition mode and on a second number of samples of the received broadcast signal when operating in the tracking mode.

Yet another aspect of a wireless communications device relates to a receiver configured to receive a broadcast signal from a wireless broadcast network, and operate in either an acquisition mode or a tracking mode. Additionally, included are means for setting a gain control value based on a first number of samples of the received broadcast signal when the receiver is operating in the acquisition mode and on a second number of samples of the received broadcast signal when the receiver is operating in the tracking mode.

Still a further aspect of a mobile communications device relates to a receiver having automatic gain control circuitry. The receiver is configured to receive a broadcast signal from a wireless broadcast network, and operate in either an acquisition mode or a tracking mode. The automatic gain control circuitry is configured to set a gain control value periodically at a first rate when the receiver is operating in the acquisition mode and periodically at a second rate when the receiver is operating in the tracking mode.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Various aspects of a wireless communications system are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

Techniques for broadcasting different types of transmissions (e.g., local and wide-area transmissions) in a wireless broadcast network are described herein. As used herein, "broadcast" and "broadcasting" refer to transmission of content/data to a group of users of any size and may also be referred to as "multicast" or some other terminology. A wide-area transmission is a transmission that may be broadcast by all or many transmitters in the network. A local transmission is a transmission that may be broadcast by a subset of the transmitters for a given wide-area transmission. Different local transmissions may be broadcast by different subsets of the transmitters for a given wide-area transmission. Different wide-area transmissions may also be broadcast by different groups of transmitters in the network. The wide-area and local transmissions typically carry different contents, but these transmissions may also carry the same content.

Figure 1A:
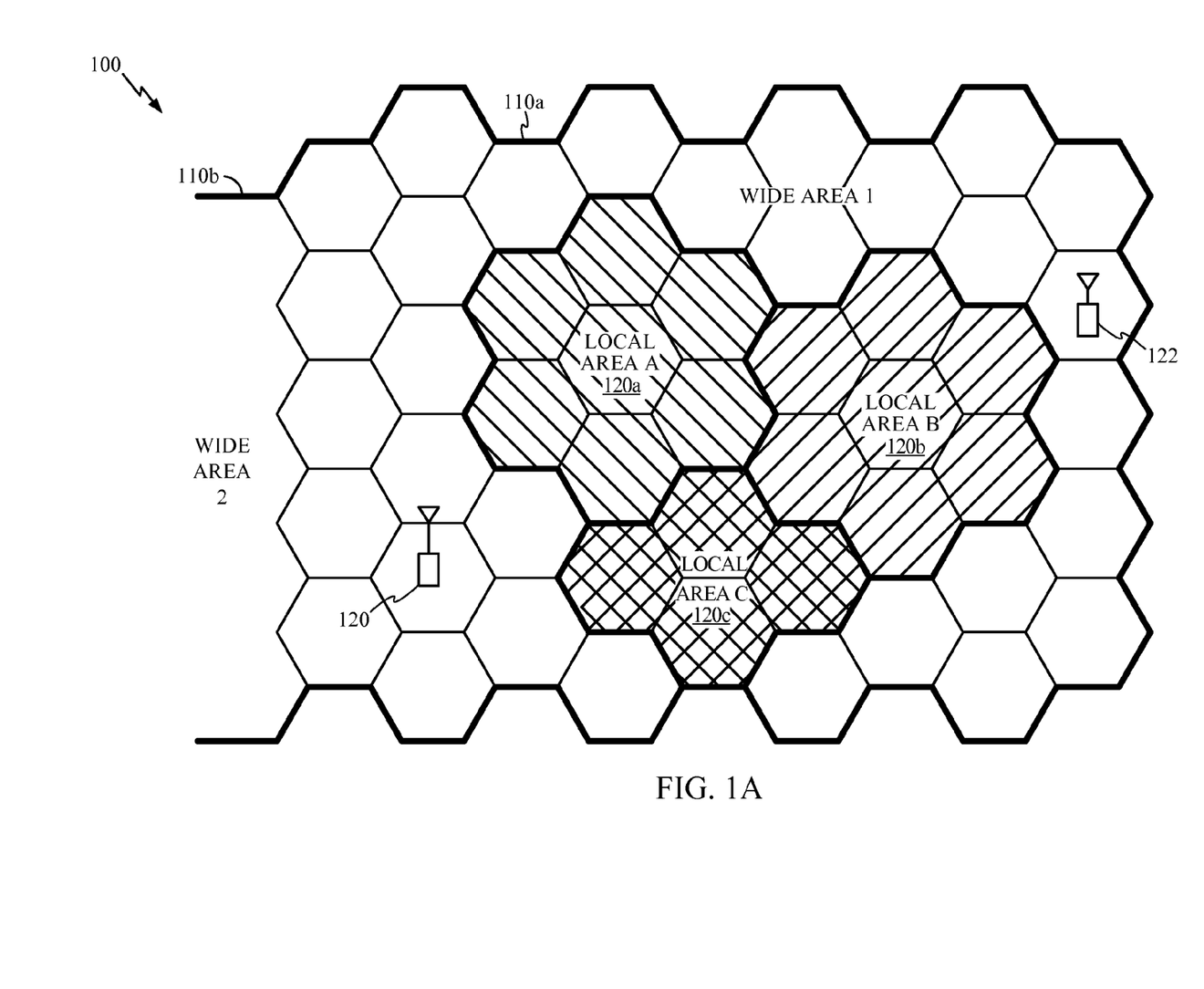
FIG. 1A illustrates an exemplary wireless broadcast network in accordance with the principles of the present invention.

FIG. 1 shows a wireless broadcast network 100 that can broadcast different types of transmission such as, for example, wide-area transmissions and local transmissions. Each wide-area transmission is broadcast by a set of base stations in the network, which may include all or many base stations in the network. Each wide-area transmission is typically broadcast over a large geographic area. Each local transmission is broadcast by a subset of the base stations in a given set for a given wide-area transmission. Each local transmission is typically broadcast over a smaller geographic area. For simplicity, the large geographic area for a wide-area transmission is also called a wide coverage area or simply a "wide area", and the smaller geographic area for a local transmission is also called a local coverage area or simply a "local area". Network 100 may have a large coverage area such as the entire United States, a large region of the United States (e.g., the western states), an entire state, and so on. For example, a single wide-area transmission may be broadcast over the entire state of California, and different local transmissions may be broadcast over different cities such as Los Angeles and San Diego.

For simplicity, FIG. 1A shows network 100 covering wide areas 110a and 110b, with wide-area 110a encompassing three local areas 120a, 120b, and 120c. In general, network 100 may include any number of wide areas with different wide-area transmissions and any number of local areas with different local transmissions. Each local area may adjoin another local area or may be isolated. Network 100 may also broadcast any number of different types of transmission designated for reception over geographic areas of any number of different sizes. For example, network 100 may also broadcast a venue transmission designated for reception over a smaller geographic area, which may be portion of a given local area.

One example of such a broadcast network is the QUALCOMM MediaFLO™ network that delivers a programming lineup with a bit rate of about 2 bits per second per Hz. The technology used is an orthogonal frequency division multiplexing (OFDM)-based air interface designed specifically for multicasting a significant volume of rich multimedia content cost effectively to wireless subscribers. It takes advantage of multicasting technology in a single-frequency network to significantly reduce the cost of delivering identical content to numerous users simultaneously. Furthermore, the coexistence of local and wide area coverage within a single RF channel (e.g., 700 MHz) is supported as described above. This segmentation between wide area and local area supports more targeted programming, local advertising, and the ability to blackout and retune as required. MediaFLO™ is merely an example of the type of broadcast networks described herein and other, functionally equivalent broadcast networks are contemplated as well.

Much like cable TV, a subscriber within a wireless broadcast network can subscribe to different packages and tiers of service (e.g., premium movies, sports, etc.) that provide them with a set of channels (e.g., tennis, ESPN, soap operas, BBC, etc.). Different content providers forward the content to the broadcast network which then combines the content and broadcast it according to a predetermined schedule. During provisioning of a user's mobile device the capability to receive and decode the channels to which the user subscribes is programmed into the mobile device. The provisioning may be subsequently updated to remove or add other packages and channels. Thus, there is a broadcast network operator that broadcasts a variety of content, but there is also the carrier (e.g., Verizon, Xingular, etc.), who provisions the handsets, that determine what portions of the content can be subscribed to by a user of the carrier. One of ordinary skill will recognize that the hierarchical arrangement of channels just described is merely one example of how to provide multimedia and other content. Other arrangements and organization of the data and its respective channels may be utilized without departing from the scope of the present invention.

Figure 1B:
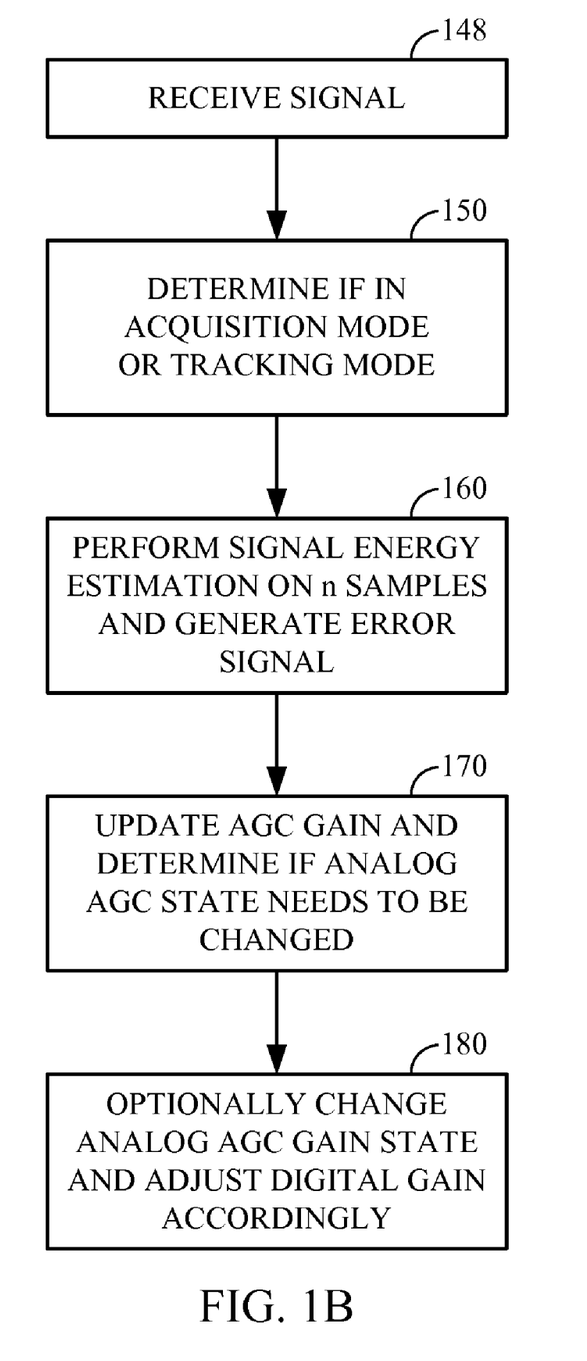
FIG. 1B depicts a flowchart of an exemplary method of controlling AGC circuitry.
Figure 1C:
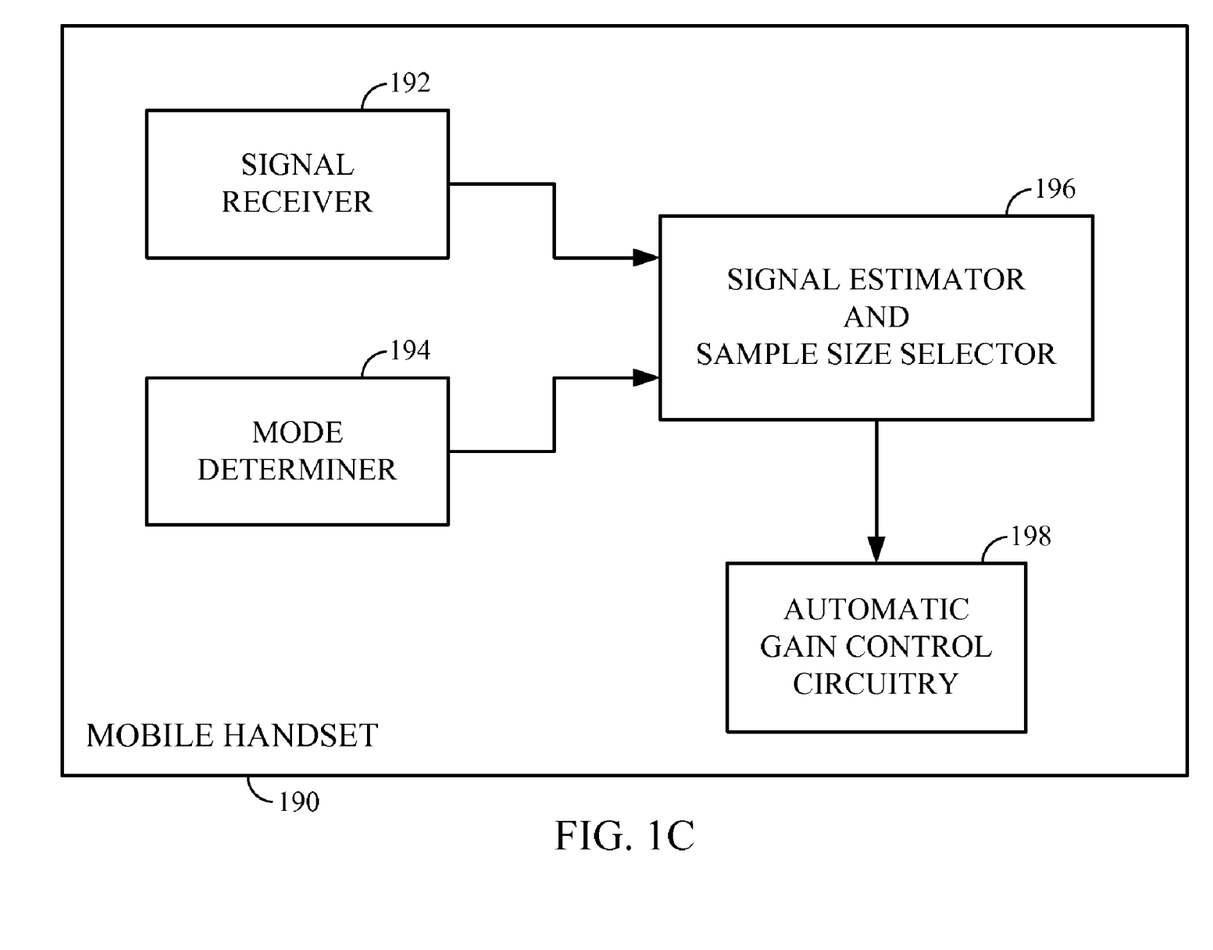
FIG. 1C depicts a system in which the exemplary method of FIG. 1B may be implemented.

FIG. 1B depicts a flowchart of exemplary method for controlling automatic gain circuitry within a mobile handset 190 for use in a wireless broadcast network. Details of the high-level flowchart are provided herein with reference to later figures. In step 148, the receiving circuitry of the mobile handset 190 receives the broadcast signal and operates so as to decode and demodulate the received signal. The behavior of the AGC circuitry within the mobile handset 190 depends on whether the mobile handset 190 is operating in "tracking" mode or "acquisition" mode. When the mobile handset 190 is powered-up, awakens from an idle mode or sleep, or otherwise must reacquire the broadcast signal, various parts of the receiver 192 operate in acquisition mode to detect the timing parameters and other information of the broadcast signal. In general, acquisition mode is the mode in which no data packet is being decoded and the system is acquiring frequency and timing information or, for example, training the AGC. Tracking mode is when data decoding is performed. Thus, the AGC circuitry 198 can operate in acquisition and tracking mode and the receiver 192 operates in acquisition mode and data demodulation (or decode) mode.

Thus, in step 150, a determination is made using a mode determiner 194 whether the AGC circuitry of the mobile handset 190 is attempting to acquire the power of the broadcast signal or is merely tracking the power of an already acquired signal. In step 160, the AGC circuitry 198 performs an energy estimate of the AGC output signal. An error signal that is the ratio of a predetermined energy reference to the energy estimate of the AGC output signal is determined using signal estimator 196. The energy estimate is typically performed using n samples of the AGC output signal. If n is large, the energy estimate is performed for a relatively large time period as compared to a smaller value for n. Thus, the behavior of the AGC circuitry 198 of the mobile handset 190 may be controlled by making n a variable value that is dependent on whether the AGC block is in the acquisition mode or the tracking mode.

Based on the error signal from the reference level, the AGC circuitry updates its gain and also determines whether or not an analog gain state change command is required, in step 170. If so, the analog gain state is changed in step 180 and the digital gain of the AGC is adjusted accordingly. In particular, when a received signal becomes much stronger, not as much gain is required and the analog gain setting for the AGC circuitry may be decreased. Alternatively, the analog gain setting may be increased when a received signal begins to fade.

The specific way in which the broadcast network signals can be arranged and broadcast can vary greatly without departing from the spirit and scope of the present invention. Additionally, the particular format and encoding of notification messages and control channel information can vary as well. Described below, however, is one particular implementation of a wireless broadcast network within which the method in flowchart 3 may be implemented.

More particularly, the data, pilots, and overhead information for local and wide-area transmissions may be multiplexed in various manners. For example, the data symbols for the wide-area transmission may be multiplexed onto a "transmission span" allocated for the wide-area transmission, the data symbols for the local transmission may be multiplexed onto a transmission span allocated for the local transmission, the TDM (time division multiplexed) and/or FDM (frequency division multiplexed) pilots for the wide-area transmission may be multiplexed onto a transmission span allocated for these pilots, and the TDM and/or FDM pilots for the local transmission may be multiplexed onto a transmission span allocated for these pilots. The overhead information for the local and wide-area transmissions may be multiplexed onto one or more designated transmission spans. The different transmission spans may correspond to (1) different sets of frequency subbands if FDM is utilized by the wireless broadcast network, (2) different time segments if TDM is utilized, or (3) different groups of subbands in different time segments if both TDM and FDM are utilized. Various multiplexing schemes are described below. More than two different types of transmission with more than two different tiers of coverage may also be processed, multiplexed, and broadcast. A wireless device in the wireless broadcast network performs the complementary processing to recover the data for the local and wide-area transmissions.

Figure 2:
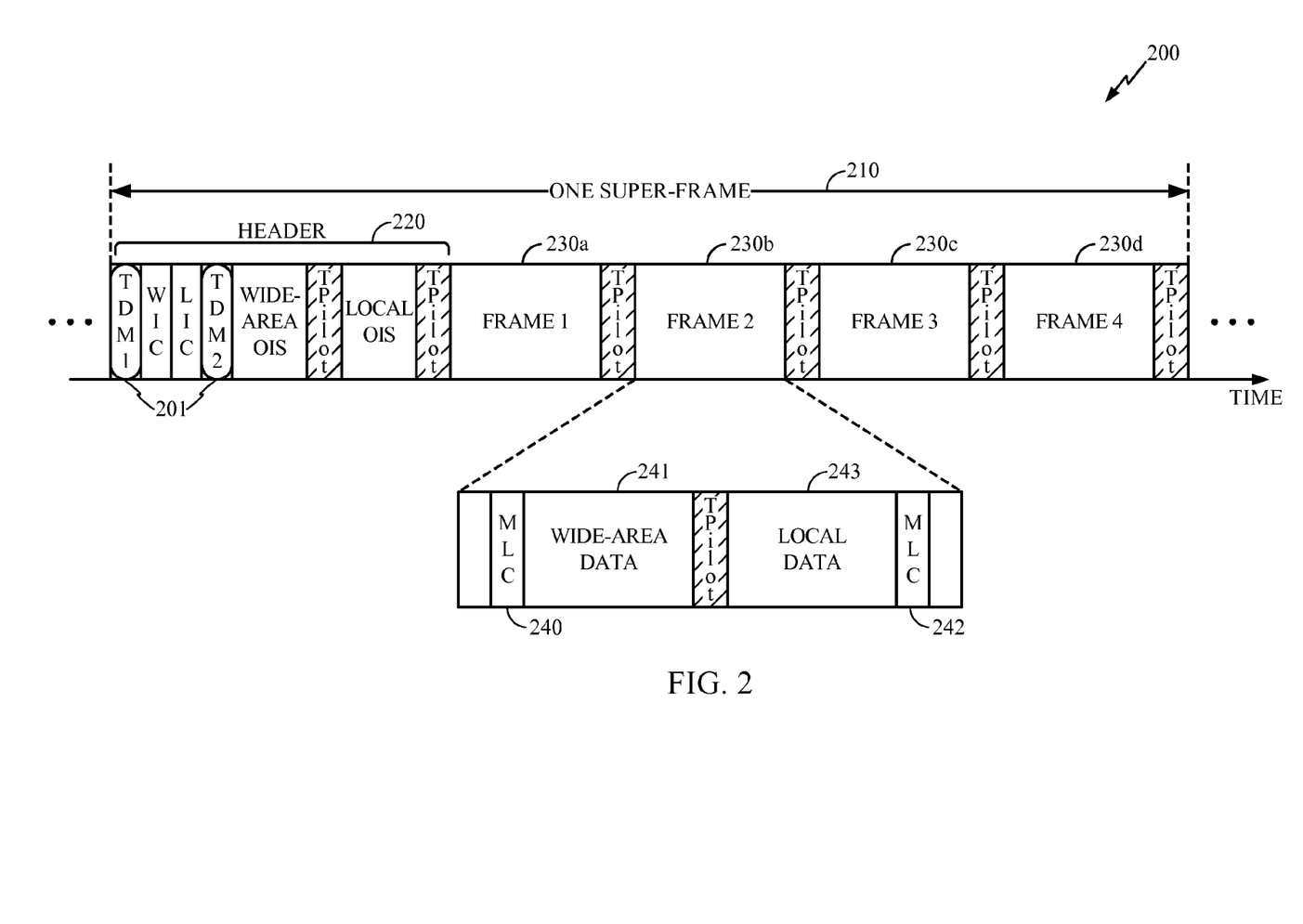
FIG. 2 an exemplary superframe that can be used to provide content within a wireless broadcast network such as that of FIG. 1.

FIG. 2 shows an exemplary super-frame structure 200 that may be used to broadcast local and wide-area transmissions in an OFDM-based wireless broadcast network. Data transmission occurs in units of super-frames 210. Each super-frame spans a predetermined time duration, which may be selected based on various factors such as, for example, the desired statistical multiplexing for data streams being broadcast, the amount of time diversity desired for the data streams, acquisition time for the data streams, buffer requirements for the wireless devices, and so on. A super-frame size of approximately one second may provide a good tradeoff between the various factors noted above. However, other super-frame sizes may also be used.

For the embodiment shown in FIG. 2, each super-frame 210 includes a header segment 220, four equal-size frames 430*a* through 430*d*, and a trailer segment 240, which are not shown to scale in FIG. 2. Table 1 lists the various fields for segments 220 and 240 and for each frame 230.

| Fields | Description |
|---|---|
| TDM Pilot | TDM Pilot used for signal detection, frame synchronization, frequency error estimation, and time synchronization |
| Transition Pilot | Pilot used for channel estimation and possibly time synchronization and sent at the boundary of wide-area and local fields/transmissions |
| WIC | Wide-Area identification channel - carries an identifier assigned to the wide-area being served |
| LIC | Local identification channel - carries an identifier assigned to the local area being served |
| Wide-Area OIS | Wide-Area overhead information symbol - carries overhead information (e.g., frequency/time location and allocation) for each data channel being sent in the wide-area data field |
| Local OIS | Local overhead information symbol - carries overhead information for each data channel being sent in the local data field |
| Wide-Area Data | Carries data channels for the wide-area transmission |
| Local Data | Carries data channels for local transmission |

For the embodiment shown in FIG. 2, different pilots are used for different purposes. A pair of TDM pilots 201 are transmitted at or near the start of each super-frame and may be used for the purposes noted in Table 1. For example, one of the pilots TDM1 may be used for coarse timing to detect the beginning of the frame 400, while the other pilot TDM2 may be used to provide a long channel estimate. A transition pilot is sent at the boundary between local and wide-area fields/transmissions, and allows for seamless transition between the local and wide-area fields/transmissions.

The local and wide-area transmissions may be for multimedia content such as video, audio, teletext, data, video/audio clips, and so on, and may be sent in separate data streams. For example, a single multimedia (e.g., television) program may be sent in three separate data streams for video, audio, and data. The data streams are sent on data channels. Each data channel may carry one or multiple data streams. A data channel carrying data streams for a local transmission is also called a "local channel", and a data channel carrying data streams for a wide-area transmission is also called a "wide-area channel". The local channels are sent in the Local Data fields and the wide-area channels are sent in the Wide-Area Data fields of the super-frame. Thus, within the wide-area data 241 of a frame 230*b*, there are a number of MediaFLO logical channels (MLCs) 240 (although only one is depicted in FIG. 2. Each MLC is a logical channel that represents a separate video, audio, or data stream. The local data 243 is also separated into many different logical channels 242. When decoding portions of a frame, the mobile device may receive and decode only the MLC 240, 242 for which an application is requesting data. As explained in more detail herein, the timing information, or "location" of the MLC 240, 242, is included in the overhead information (i.e., Wide-Area OIS and Local OIS) of the header 220.

Each data channel may be "allocated" a fixed or variable number of interlaces in each super-frame depending on the payload for the data channel, the availability of interlaces in the super-frame, and possibly other factors. Each data channel may be active or inactive in any given super-frame. Each active data channel is allocated at least one interlace. Each active data channel is also "assigned" specific interlaces within the super-frame based on an assignment scheme that attempts to (1) pack all of the active data channels as efficiently as possible, (2) reduce the transmission time for each data channel, (3) provide adequate time-diversity for each data channel, and (4) minimize the amount of signaling needed to indicate the interlaces assigned to each data channel. For each active data channel, the same interlace assignment may be used for the four frames of the super-frame.

The Local OIS field indicates the time-frequency assignment for each active local channel for the current super-frame. The Wide-Area OIS field indicates the time-frequency assignment for each active wide-area channel for the current super-frame. The Local OIS and Wide-Area OIS are sent at the start of each super-frame to allow the wireless devices to determine the time-frequency location of each data channel of interest in the super-frame.

The various fields of the super-frame may be sent in the order shown in FIG. 2 or in some other order. In general, it is desirable to send the TDM pilot and overhead information early in the super-frame so that the TDM pilot and overhead information can be used to receive the data being sent later in the super-frame. The wide-area transmission may be sent prior to the local transmission, as shown in FIG. 2, or after the local transmission.

FIG. 2 shows a specific super-frame structure. In general, a super-frame may span any time duration and may include any number and any type of segments, frames, and fields. However, there is normally a useful range of super-frame durations related to acquisition time and cycling time for the receiver electronics. Other super-frame and frame structures may also be used for broadcasting different types of transmission, and this is within the scope of the invention.

The pilot signals of FIG. 2 that are transmitted during the broadcast transmission may be used to derive (1) a channel estimate for the wide-area transmission, which is also called a wide-area channel estimate, and (2) a channel estimate for the local transmission, which is also called a local channel estimate. The local and wide-area channel estimates may be used for data detection and decoding for the local and wide-area transmissions, respectively. These pilots may also be used for channel estimation, time synchronization, acquisition (e.g., automatic gain control (AGC)), and so on. The transition pilot may also be used to obtain improved timing for the local transmission as well as the wide-area transmission.

In one particular example, the basic signal unit for the wireless broadcast network is an OFDM symbol that consists of 4642 time-domain baseband samples called OFDM chips. Among these OFDM chips are 4096 data chips. The data chips are cyclically extended with 529 chips preceding the data portion and 17 chips following the data portion. The first 17 chips of an OFDM symbol may overlap the last 17 chips of the OFDM symbol that precede them. As a result, the time duration of each OFDM symbol is 4625 chips long. And may be transmitted for example, at $5.55 \times 10^6$ chips/second. Although some of the AGC circuitry described herein is discussed with reference to this specific OFDM arrangement, one of ordinary skill will recognize that other values for various OFDM symbols may also be used without departing from the scope of the present invention.

Figure 3:
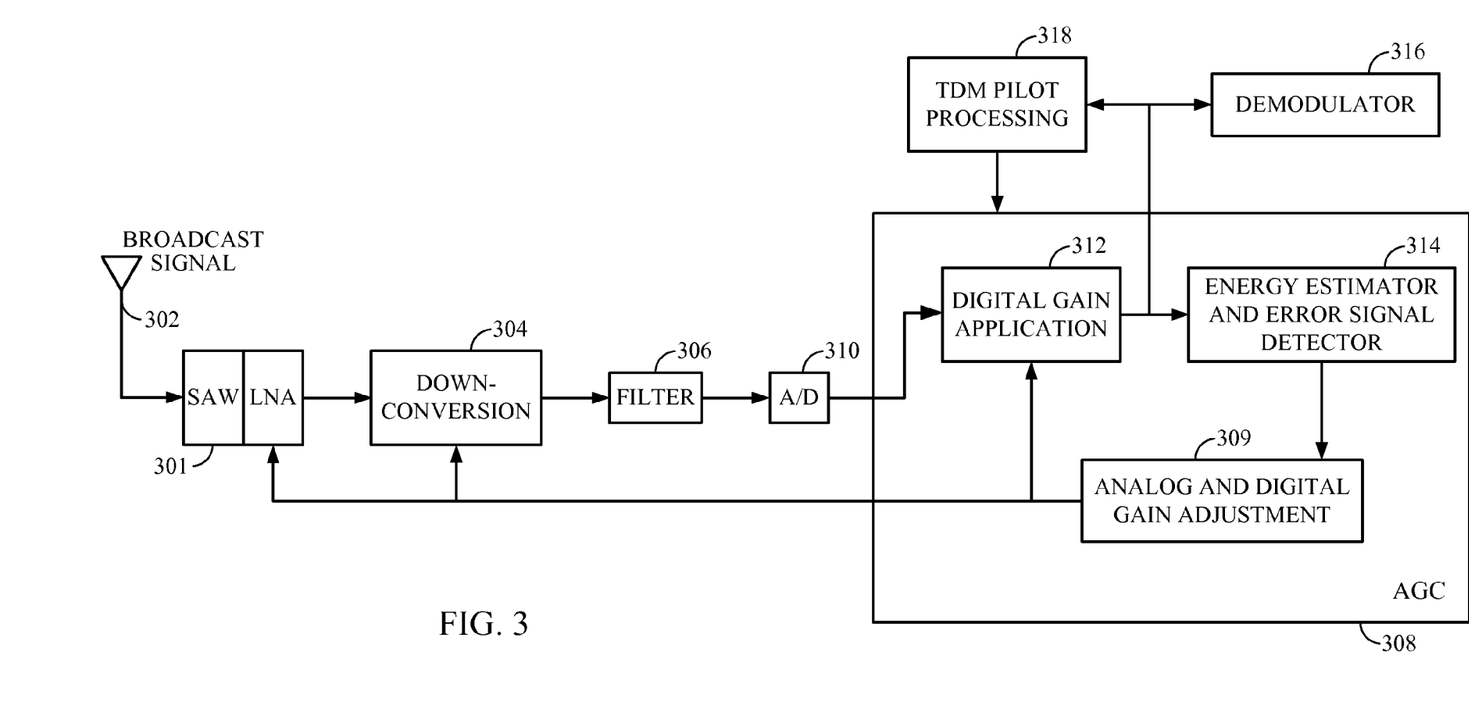
FIG. 3 depicts a functional diagram of AGC circuitry within a mobile handset for use in a wireless broadcast network.

FIG. 3 depicts a functional-level diagram of exemplary AGC circuitry within a receiving portion of a mobile handset. The broadcast signal is received by the antenna 302, and may be filtered by a surface acoustic wave (SAW) filter 301, amplified by the low noise amplifier (LNA) 301, and passed to down conversion circuitry 304 and optional filtering components 306. At this stage, the signal remains an analog signal but is now a baseband signal. For example, the broadcast signal centered at 700 MHz in a MediFLO® network would be converted to a signal between −3-+3 MHz. This signal is then passed to the A/D converter 310 for conversion into digital samples. AGC circuitry 308 provides a feedback control loop to set a gain level within the down converter 304 and the LNA block. Within the AGC circuitry 308, a digital gain value is applied by the digital gain application circuitry 312. The resulting signal is then fed to the other components of the demodulator 316 for further processing of the signal.

In addition, the resulting signal is provided to an energy estimator and error signal detector 314 that determines the energy within n chips, or samples, of the resulting signal and an error signal that is the ratio of a predetermined energy reference to the energy estimate. This error signal is passed to an analog and digital gain adjustment block 309 and then used to adjust both the analog gain value at the downconverter 304 as well as the digital gain application 312. One of ordinary skill will recognize that there are a variety of functionally equivalent methods and techniques to estimate the energy of a signal and then set a gain value accordingly contemplated within the scope of the present invention.

As a result of the circuitry of FIG. 3, the gain control values are adjusted every n samples. The specific value of n is determined by the operating mode of the mobile handset. Thus, TDM pilot processing circuitry 318 is provided to supply a signal to the AGC circuitry 308 indicating whether the broadcast signal has yet to be acquired in terms of coarse timing acquisition and frequency acquisition. During the acquisition phase in which the receiver tries to detect TDM pilot 1 and perform the coarse frequency and timing estimation, it is desirable that the signal output of the block 312 be substantially a constant level below the full scale of AGC output. One advantageous level is, for example, 11 dB below AGC output full scale. If the signal amplitude is varying a lot and the AGC block 308 does not react fast enough, in some instances cause a mobile handset to mistakenly declare coarse timing acquisition when none is actually present or fail to properly acquire an existing signal. By setting the value for n samples to be less during acquisition mode, the gain of the receiver is potentially updated more often because the gain values are updated after every n samples. Thus, having a value of n during acquisition mode that is less than the value of n used during tracking mode, the AGC circuitry 308 is more responsive to changes in a signal that has yet to be acquired. Upon receiving the TDM1 detection signal from the TDM pilot processing circuitry 318, the AGC may switch to operate in the tracking mode.

In the exemplary OFDM symbol described above having 4096 data chips, a value of 256 chips for n provides advantageous results over many different operating conditions of a mobile handset within a wireless broadcast network. Thus, during a single OFDM symbol, the AGC gain control values are updated approximately 16 times. In contrast, during tracking mode, adjustments occurring once every OFDM symbol (i.e., every 4625 samples) provide advantageous results. Thus, during acquisition mode, the feedback loop of the AGC circuitry 308 updates the analog and digital gain values about 16 times as frequently as when operating in the tracking mode. As mentioned, this particular relationship (e.g., 16 times), provides advantageous improvements in accuracy while acquiring the TDM pilot signal. However, if for example, more false positives can be tolerated (which increases power consumption), this relationship may be lowered to around 8 times as frequent. Furthermore, the number of n samples selected during acquisition mode may be a function of the total number of samples within an OFDM symbol. Accordingly, if there were 8192 data chips in an OFDM symbol, then the AGC gain value updates may be set to occur every 512 samples.

Figure 4:
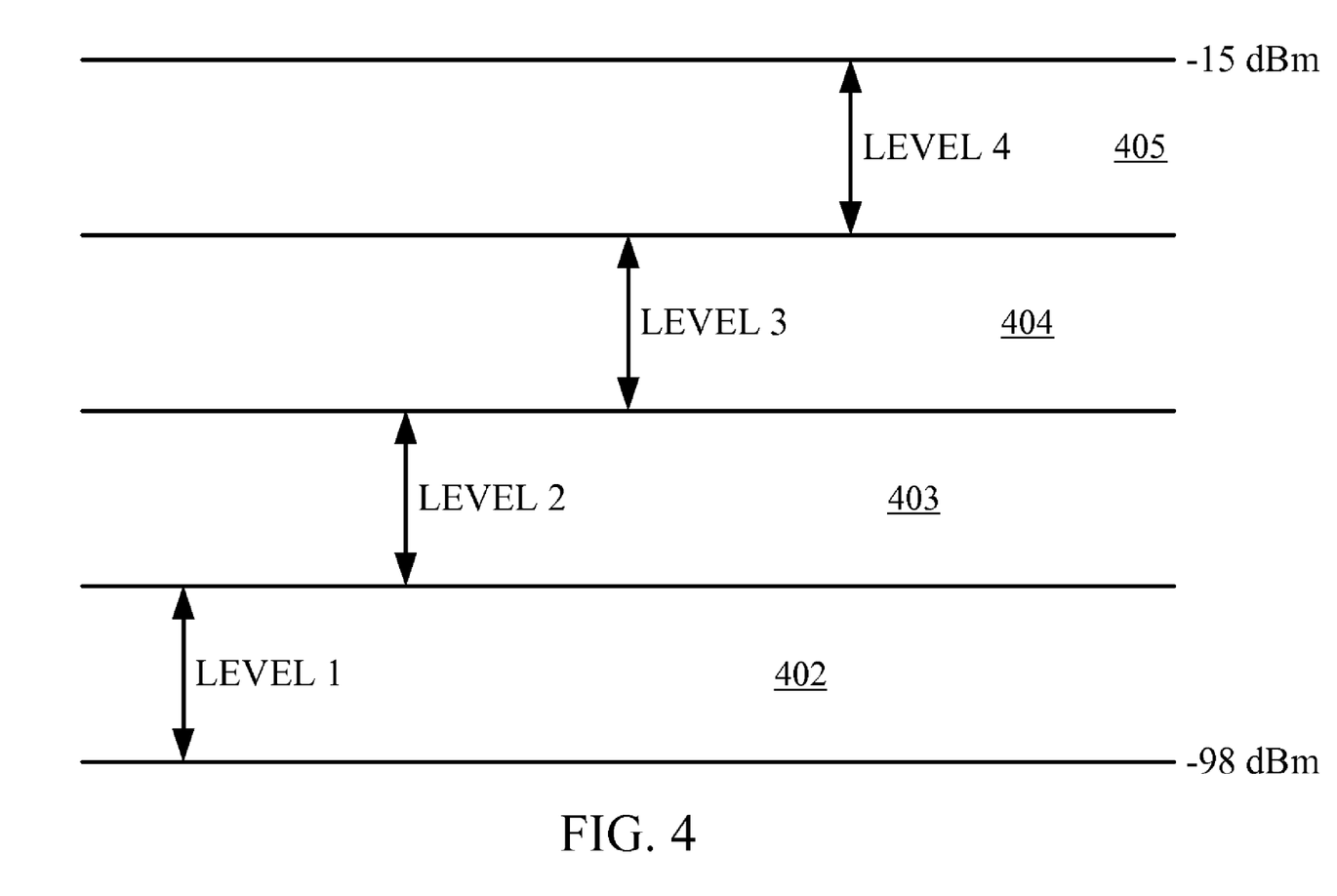
FIG. 4 depicts a conceptual view of different signal levels and gain control settings applied thereto.

FIG. 4 provides a conceptual diagram of different discrete analog gain values within the received signal. In this example, the received signals are logically separated into four different levels, each level corresponding to a different gain value to be applied within the analog circuitry of AGC. In operation, the AGC circuitry 308 attempts to provide a signal to the demodulator 316 having a constant power level. For example, the desired, constant power level may be −11 dB from the AGC output full scale. First, the AGC circuitry sets the analog gain value to one of four values 402, 403, 404, 405, depending on the current energy estimate of the AGC output signal. A received signal in the Level 1 402 would require greater amplification than one in the Level 3 range and the AGC sets the gain control value accordingly. For example, gain values 402-405 may be 53 dB, 37 dB, 22 dB, and 6 dB respectively. This can be thought of as a course gain adjustment of the analog signal that is applied at the downconverter 304 and the LNA block. However, even within a particular level, the energy estimate may vary in range. This variation is handled by the digital gain adjustment 312 so that it applies a continuous digital gain based on the current energy estimate to bring the signal to the desired level. This can be thought of as a fine gain adjustment. Depending on the value of n samples used to calculate the energy estimate, the current gain value settings are updated by the error signal which is the ratio of the most recent energy estimate and the desired reference level, and any changes to the settings are implemented as needed. The new gain value settings are then used until the next energy estimate is completed.

Figure 5:
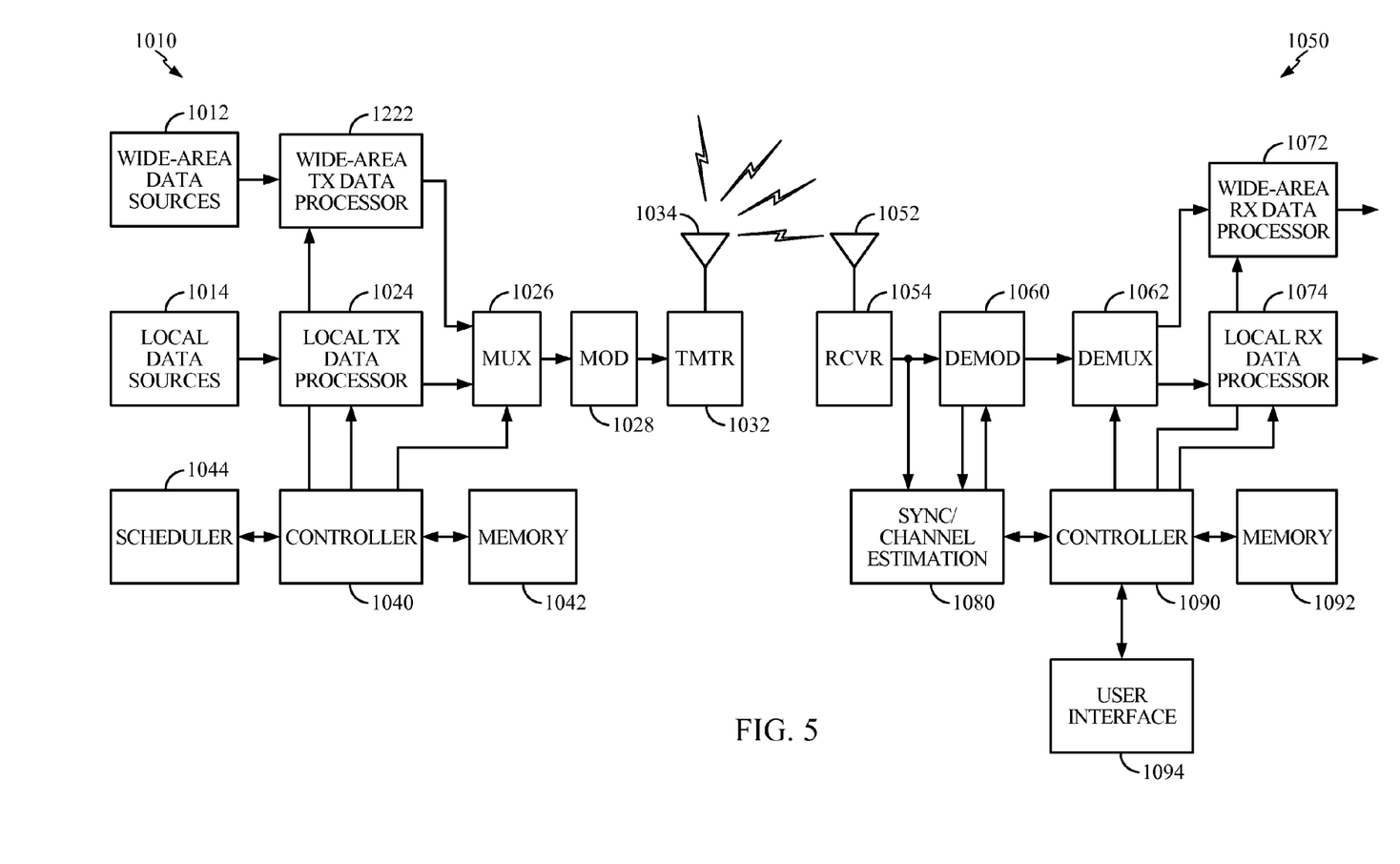
FIG. 5 depicts a block diagram of a wireless broadcast base station and handset.

FIG. 5 shows a block diagram of a base station 1010 and a wireless device 1050 that may be used to implement the wireless broadcast network 100 in FIG. 1. Base station 1010 is generally a fixed station and may also be called an access point, a transmitter, or some other terminology. Wireless device 1050 may be fixed or mobile and may also be called a user terminal, a mobile station, a receiver, or some other terminology. Wireless device 1050 may also be a portable unit such as a cellular phone, a handheld device, a wireless module, a personal digital assistant (PDA), and so on.

At base station 1010, a transmit (TX) data processor 1022 receives data for a wide-area transmission from sources 1012, processes (e.g., encodes, interleaves, and symbol maps) the wide-area data, and generates data symbols for the wide-area transmission. A data symbol is a modulation symbol for data, and a modulation symbol is a complex value for a point in a signal constellation for a modulation scheme (e.g., M-PSK, M-QAM, and so on). TX data processor 1022 also generates the FDM and transition pilots for the wide area in which base station 1010 belongs and provides the data and pilot symbols for the wide area to a multiplexer (Mux) 1026. A TX data processor 1024 receives data for a local transmission from sources 1014, processes the local data, and generates data symbols for the local transmission. TX data processor 1024 also generates the pilots for the local area in which base station 1010 belongs and provides the data and pilot symbols for the local area to multiplexer 1026. The coding and modulation for data may be selected based on various factors such as, for example, whether the data is for wide-area or local transmission, the data type, the desired coverage for the data, and so on.

Multiplexer 1026 multiplexes the data and pilot symbols for the local and wide areas as well as symbols for overhead information and the TDM pilot onto the subbands and symbol periods allocated for these symbols. A modulator (Mod) 1028 performs modulation in accordance with the modulation technique used by network 100. For example, modulator 1028 may perform OFDM modulation on the multiplexed symbols to generate OFDM symbols. A transmitter unit (TMTR) 1032 converts the symbols from modulator 1028 into one or more analog signals and further conditions (e.g., amplifies, filters, and frequency upconverts) the analog signal(s) to generate a modulated signal. Base station 1010 then transmits the modulated signal via an antenna 1034 to wireless devices in the network.

At wireless device 1050, the transmitted signal from base station 1010 is received by an antenna 1052 and provided to a receiver unit (RCVR) 1054. Receiver unit 1054 conditions (e.g., filters, amplifies, and frequency downconverts) the received signal and digitizes the conditioned signal to generate a stream of data samples. A demodulator (Demod) 1060 performs (e.g., OFDM) demodulation on the data samples and provides received pilot symbols to a synchronization (Sync)/channel estimation unit 1080. Unit 1080 also receives the data samples from receiver unit 1054, determines frame and symbol timing based on the data samples, and derives channel estimates for the local and wide areas based on the received pilot symbols for these areas. Unit 1080 provides the symbol timing and channel estimates to demodulator 1060 and provides the frame timing to demodulator 1060 and/or a controller 1090. Demodulator 1060 performs data detection on the received data symbols for the local transmission with the local channel estimate, performs data detection on the received data symbols for the wide-area transmission with the wide-area channel estimate, and provides detected data symbols for the local and wide-area transmissions to a demultiplexer (Demux) 1062. The detected data symbols are estimates of the data symbols sent by base station 1010 and may be provided in log-likelihood ratios (LLRs) or some other form.

Demultiplexer 1062 provides detected data symbols for all wide-area channels of interest to a receive (RX) data processor 1072 and provides detected data symbols for all local channels of interest to an RX data processor 1074. RX data processor 1072 processes (e.g., deinterleaves and decodes) the detected data symbols for the wide-area transmission in accordance with an applicable demodulation and decoding scheme and provides decoded data for the wide-area transmission. RX data processor 1074 processes the detected data symbols for the local transmission in accordance with an applicable demodulation and decoding scheme and provides decoded data for the local transmission. In general, the processing by demodulator 1060, demultiplexer 1062, and RX data processors 1072 and 1074 at wireless device 1050 is complementary to the processing by modulator 1028, multiplexer 1026, and TX data processors 1022 and 1024, respectively, at base station 1010.

Controllers 1040 and 1090 direct operation at base station 1010 and wireless device 1050, respectively. These controllers may be hardware-based, software-based or a combination of both. Memory units 1042 and 1092 store program codes and data used by controllers 1040 and 1090, respectively. A scheduler 1044 schedules the broadcast of local and wide-area transmissions and allocates and assigns resources for the different transmission types.

For clarity, FIG. 5 shows the data processing for the local and wide-area transmissions being performed by two different data processors at both base station 1010 and wireless device 1050. The data processing for all types of transmission may be performed by a single data processor at each of base station 1010 and wireless device 1050. FIG. 3 also shows the processing for two different types of transmission. In general, any number of types of transmission with different coverage areas may be transmitted by base station 1010 and received by wireless device 1050. For clarity, FIG. 3 also shows all of the units for base station 1010 being located at the same site. In general, these units may be located at the same or different sites and may communicate via various communication links. For example, data sources 1012 and 1014 may be located off site, transmitter unit 1032 and/or antenna 1034 may be located at a transmit site, and so on. A user interface 1094 is also in communication with the controller 1090 that allows the user of the device 1050 to control aspects of its operation. For example, the interface 1094 can include a keypad and display along with the underlying hardware and software needed to prompt a user for commands and instructions and then to process them once they are received.

The techniques described herein for broadcasting different types of transmission over the air may be implemented by various means. For example, these techniques may be implemented in hardware, software, or a combination thereof For a hardware implementation, the processing units at a base station used to broadcast different types of transmission may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof The processing units at a wireless device used to receive different types of transmission may also be implemented within one or more ASICs, DSPs, and so on.

For a software implementation, the techniques described herein may be implemented with modules (e.g., procedures, functions, and so on) that perform the functions described herein. The software codes may be stored in a memory unit (e.g., memory unit 1042 or 1092 in FIG. 5) and executed by a processor (e.g., controller 1040 or 1090). The memory unit may be implemented within the processor or external to the processor, in which case it can be communicatively coupled to the processor via various means as is known in the art.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but is to be accorded the full scope consistent with the language claims, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A mobile communications device comprising:
   a receiver configured to operate in either an acquisition mode or a tracking mode and receive a signal comprising a plurality of Orthogonal Frequency Division Multiplex (OFDM) symbols; and
   automatic gain control circuitry configured to set a gain control value based on a first number of samples of the received signal when the receiver is operating in the acquisition mode, where the first number of samples is less than a number of samples for a one of the plurality of OFDM symbols, and on a second number of samples of the received signal when the receiver is operating in the tracking mode.

2. The mobile communications device of claim 1, wherein the first number of samples is less than the second number of samples.

3. The mobile communications device of claim 1, wherein the second number of samples comprises the number of samples for the one of the plurality of OFDM symbols.

4. The mobile communications device of claim 1, wherein the first number of samples comprises a fraction of approximately one eighth or less of the number of samples of one of the plurality of OFDM symbols.

5. The mobile communications device of claim 1, wherein the first number of samples comprises one sixteenth or less of one of the plurality of OFDM symbols.

6. The mobile communications device of claim 1, wherein the received signal includes a TDM pilot signal.

7. The mobile communications device of claim 6, further comprising:
   a processor configured to operate the receiver in the acquisition mode if the TDM pilot signal has not been acquired and operate the receiver in the tracking mode once the TDM pilot signal has been acquired.

8. The mobile communications device of claim 1, wherein the automatic gain control circuitry is further configured to determine an energy estimate of the received signal.

9. The mobile communications device of claim 1, wherein the automatic gain control circuitry is further configured to set the gain control value based on an energy estimate of the first number of samples when the receiver is operated in the acquisition mode.

10. The mobile communications device of claim 1, wherein the automatic gain control circuitry is further configured to set the gain control value based on an energy estimate of the second number of samples when the receiver is operated in the tracking mode.

11. The mobile communications device of claim 1, wherein the gain control value comprises a plurality of values.

12. The mobile communications device of claim 1, wherein the gain control value includes an analog control value and a digital control value.

13. A method for automatic gain control in a mobile communications device, comprising:
   receiving a signal comprising a plurality of Orthogonal Frequency Division Multiplex (OFDM) symbols from a wireless network;
   operating in either an acquisition mode or a tracking mode; and
   setting a gain control value based on a first number of samples of the received signal when operating in the acquisition mode, where the first number of samples is less than a number of samples for a one of the plurality of OFDM symbols, and on a second number of samples of the received signal when operating in the tracking mode.

14. The method of claim 13, wherein the first number of samples is less than the second number of samples.

15. The method of claim 13, wherein the second number of samples comprises the number of samples for the one of the plurality of OFDM symbols.

16. The method of claim 13, wherein the received signal includes a TDM pilot signal.

17. The method of claim 16, further comprising:
   operating in the acquisition mode if the TDM pilot signal has not been acquired; and operating in the tracking mode once the TDM pilot signal has been acquired.

18. The method of claim 13, further comprising: determining an energy estimate of the received signal.

19. The method of claim 18 further comprising: determining an error signal which represents a power difference between the energy estimate and a desired reference level.

20. The method of claim 13, wherein the gain control value comprises a plurality of values.

21. A wireless communications device having a receiver configured to receive a signal from a wireless network, and operate in either an acquisition mode or a tracking mode, the device comprising:
means for estimating a received signal energy of the signal comprising a plurality of Orthogonal Frequency Division Multiplex (OFDM) symbols based on a first number of samples of the received signal when the receiver is operating in the acquisition mode and on a second number of samples of the received signal when the receiver is operating in the tracking mode, wherein the first number of samples is less than a number of samples for a one of the plurality of OFDM symbols; and
means for setting a gain control value based on the estimate of the received signal energy.

22. A mobile communications device comprising:
a receiver configured to receive a signal from a wireless network, the signal comprising a plurality of Orthogonal Frequency Division Multiplex (OFDM) symbols, and operate in either an acquisition mode or a tracking mode; and
automatic gain control circuitry configured to set a gain control value periodically at a first rate that is higher than an OFDM symbol rate when the receiver is operating in the acquisition mode and periodically at a second rate when the receiver is operating in the tracking mode.

23. The mobile communications device of claim 22, wherein the first rate is more frequent than the second rate.

24. A computer-readable memory unit encoded with a computer program for automatic gain control in a mobile communications device, which upon execution cause one or more processors to:
receive a signal comprising a plurality of Orthogonal Frequency Division Multiplex (OFDM) symbols from a wireless network;
operate in either an acquisition mode or a tracking mode; and
set a gain control value based on a first number of samples of the received signal when operating in the acquisition mode, where the first number of samples is less than a number of samples for a one of the plurality of OFDM symbols, and on a second number of samples of the received signal when operating in the tracking mode.

25. The computer-readable memory unit of claim 24, wherein the first number of samples is less than the second number of samples.

26. The computer-readable memory unit of claim 24, wherein the second number of samples comprises the number of samples for the one of the plurality of OFDM symbols.

27. The computer-readable memory unit of claim 24, wherein the received signal includes a TDM pilot signal.

28. The method of claim 13, wherein the first number of samples comprises a fraction of approximately one eighth or less of the number of samples of one of the plurality of OFDM symbols.

29. The method of claim 13, wherein the first number of samples comprises one sixteenth or less of one of the plurality of OFDM symbols.

30. The method of claim 13, wherein setting the gain control value is further based on an energy estimate of the first number of samples when operating in the acquisition mode.

31. The method of claim 13, wherein setting the gain control value is further based on an energy estimate of the second number of samples when operating in the tracking mode.

32. The method of claim 13, wherein the gain control value includes an analog control value and a digital control value.

33. The device of claim 21, wherein the first number of samples is less than the second number of samples.

34. The device of claim 21, wherein the second number of samples comprises the number of samples for the one of the plurality of OFDM symbols.

35. The device of claim 21, wherein the first number of samples comprises a fraction of approximately one eighth or less of the number of samples of one of the plurality of OFDM symbols.

36. The device of claim 21, wherein the first number of samples comprises one sixteenth or less of one of the plurality of OFDM symbols.

37. The device of claim 21, wherein the received signal includes a TDM pilot signal.

38. The device of claim 37, further comprising:
means for operating the receiver in the acquisition mode if the TDM pilot signal has not been acquired and operating the receiver in the tracking mode once the TDM pilot signal has been acquired.

39. The device of claim 21, wherein the means for setting the gain control value is further configured to determine an energy estimate of the received signal.

40. The device of claim 21, wherein the means for setting the gain control value is further configured to set the gain control value based on an energy estimate of the first number of samples when the receiver is operated in the acquisition mode.

41. The device of claim 21, wherein the means for setting the gain control value is further configured to set the gain control value based on an energy estimate of the second number of samples when the receiver is operated in the tracking mode.

42. The device of claim 21, wherein the gain control value comprises a plurality of values.

43. The device of claim 21, wherein the gain control value includes an analog control value and a digital control value.

44. The mobile communications device of claim 22, wherein the automatic gain control circuitry is further configured to determine an energy estimate of the received signal.

45. The mobile communications device of claim 22, wherein the gain control value comprises a plurality of values.

46. The mobile communications device of claim 22, wherein the gain control value includes an analog control value and a digital control value.

47. The computer-readable memory unit of claim 24, wherein the first number of samples comprises a fraction of approximately one eighth or less of the number of samples of one of the plurality of OFDM symbols.

48. The computer-readable memory unit of claim 24, wherein the first number of samples comprises one sixteenth or less of one of the plurality of OFDM symbols.

49. The computer-readable memory unit of claim 27, wherein the computer program causes the one or more processors to operate in the acquisition mode if the TDM pilot signal has not been acquired and operate in the tracking mode once the TDM pilot signal has been acquired.

50. The computer-readable memory unit of claim 24, wherein the computer program causes the one or more processors to determine an energy estimate of the received signal.

51. The computer-readable memory unit of claim 24, wherein the computer program causes the one or more processors to set the gain control value based on an energy estimate of the first number of samples when operating in the acquisition mode.

52. The computer-readable memory unit of claim 24, wherein the computer program causes the one or more processors to set the gain control value based on an energy estimate of the second number of samples when operating in the tracking mode.

53. The computer-readable memory unit of claim 24, wherein the gain control value comprises a plurality of values.

54. The computer-readable memory unit of claim 24, wherein the gain control value includes an analog control value and a digital control value.

55. The mobile communications device of claim 22, wherein the second rate comprises the OFDM symbol rate.

56. The mobile communications device of claim 22, wherein the first rate comprises a number approximately eight times or more than the OFDM symbol rate.

57. The mobile communications device of claim 22, wherein the first rate comprises a number approximately sixteen times or more than the OFDM symbol rate.

58. The mobile communications device of claim 22, wherein the received signal includes a TDM pilot signal.

59. The mobile communications device of claim 58, further comprising:
a processor configured to operate the receiver in the acquisition mode if the TDM pilot signal has not been acquired and operate the receiver in the tracking mode once the TDM pilot signal has been acquired.

60. The mobile communications device of claim 22, wherein the automatic gain control circuitry is further configured to set the gain control value based on an energy estimate of the first rate when the receiver is operated in the acquisition mode.

61. The mobile communications device of claim 22, wherein the automatic gain control circuitry is further configured to set the gain control value based on an energy estimate of the second rate when the receiver is operated in the tracking mode.

* * * * *